United States Patent
Nagaraj et al.

(10) Patent No.: US 8,344,812 B2
(45) Date of Patent: Jan. 1, 2013

(54) LOOP FILTER AND VOLTAGE CONTROLLED OSCILLATOR FOR A PHASE-LOCKED LOOP

(75) Inventors: Krishnaswamy Nagaraj, Plano, TX (US); Ajay Kumar, Dallas, TX (US); Xiao Pu, Plano, TX (US); Sreekiran Samala, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/028,340

(22) Filed: Feb. 16, 2011

(65) Prior Publication Data

US 2011/0199137 A1 Aug. 18, 2011

Related U.S. Application Data

(60) Provisional application No. 61/305,033, filed on Feb. 16, 2010.

(51) Int. Cl.
*H03L 7/00* (2006.01)
(52) U.S. Cl. .............................. 331/16; 331/34; 331/17
(58) Field of Classification Search .................... 331/16, 331/34, 17
See application file for complete search history.

(56) References Cited

U.S. PATENT DOCUMENTS 7,598,816 B2 * 10/2009 Agarwal et al. ............... 331/17
2005/0238093 A1 10/2005 Payne et al.

OTHER PUBLICATIONS

Dennis, Michael F. et al., "A 45nm SOI-CMOS Dual-PLL Processor Clock System for Multi-Protocol I/O," 2010 IEEE International Solid-State Circuits Conference, Session 13, Frequency & Clock Synthesis 13.2, Feb. 9, 2010, San Francisco, CA., pp. 246-248.

* cited by examiner

*Primary Examiner* — Arnold Kinkead
(74) *Attorney, Agent, or Firm* — Ronald O. Neerings; Wade James Brady, III; Frederick J. Telecky, Jr.

(57) ABSTRACT

A phase-locked loop includes a loop filter and a voltage controlled oscillator (VCO). The VCO includes multiple transistors, each transistor having a smaller transconductance ($g_m$) than if a single transistor were used while maintaining the same loop bandwidth and drain-to-source current through the transistor. As a result of a smaller transconductance in the VCO, a larger resistor can be used in the loop filter without increasing the noise. With a larger resistor, a smaller capacitor can be used in the loop filter as well. Alternatively, the transconductance can be reduced by a certain factor and the resistance value can be increased by the same factor to maintain a constant loop bandwidth but with a reduction in the amplitude of the noise. Thus, a smaller loop filter capacitor can be achieved albeit with the same noise level, or a lower noise level with the same size capacitor for the loop filter.

11 Claims, 3 Drawing Sheets

FIG. 4
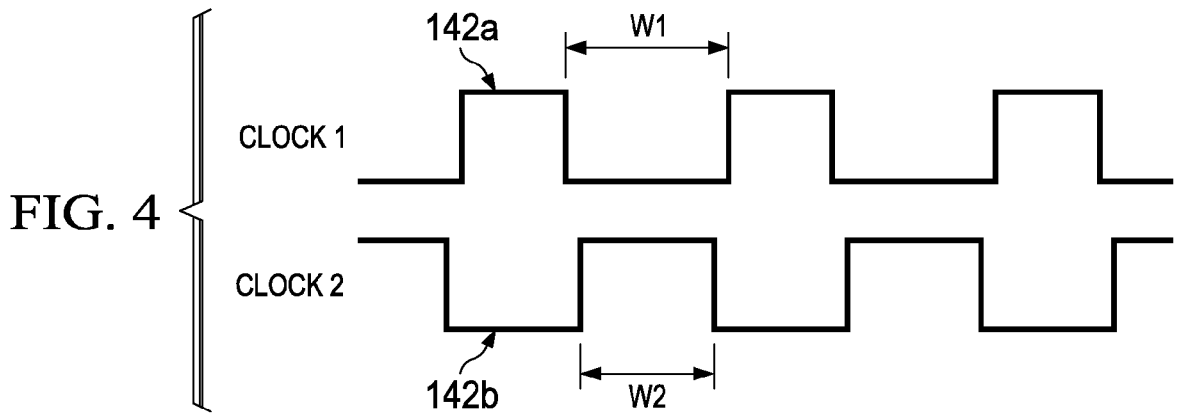
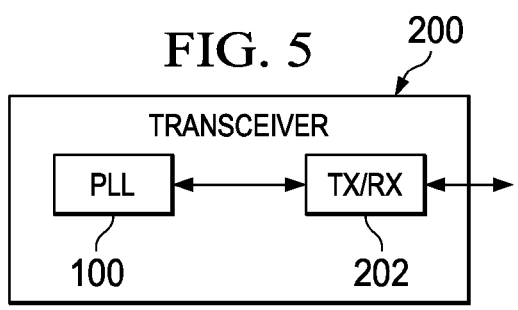
FIG. 5

LOOP FILTER AND VOLTAGE CONTROLLED OSCILLATOR FOR A PHASE-LOCKED LOOP

CROSS-REFERENCE TO RELATED APPLICATION

The present application claims priority to U.S. Provisional Patent Application No. 61/305,033, filed on Feb. 16, 2010; which is hereby incorporated herein by reference.

BACKGROUND

Phase locked loops (PLLs) are used in a variety of applications. One such application is in a transceiver to control the timing of clock signals for proper synchronization. There are a variety of types of phase-locked loops. Some types include loop filters. A loop filter often includes resistors and capacitors. Generally, larger resistance values for the resistors results in greater amplitude noise signals, which is undesirable. In order to meet noise requirements, smaller resistors are preferred. The use of smaller resistors, however, necessitates the use of larger capacitors in the loop filters. Larger capacitors, however, occupy a greater physical area which may be problematic when space is limited, such as on an integrated circuit (IC).

SUMMARY

The problems noted above are solved in large part by a phase-locked loop (PLL) that includes, among other elements, a loop filter and a voltage controlled oscillator (VCO). The VCO comprises a voltage-to-current (V-to-I) converter and a current controlled oscillator (ICO). The V-to-I converter comprises multiple units of which one or more are separated from the loop filter by an additional low pass filter. This configuration results in a smaller net transconductance as seen by the PLL loop. As a result of a smaller transconductance, a larger resistor can be used in the loop filter without increasing the noise. With a larger resistor, a smaller capacitor can be used in the loop filter as well. Alternatively, the transconductance can be reduced by a certain factor and the resistance value can be increased by the same factor to maintain a constant loop bandwidth but with a reduction in the amplitude of the noise. Thus, one can achieve a smaller loop filter capacitor albeit with the same noise level, or a lower noise level with the same size capacitor for the loop filter.

In accordance with at least some embodiments, a phase-locked loop comprises a loop filter and a voltage controlled oscillator coupled to the loop filter. The voltage controlled oscillator comprises first and second transistors and a low pass filter coupled to the second transistor. The low pass filter comprises a switched capacitor resistor.

In accordance with other embodiments, a transceiver comprises a transmitter/receiver and a phase-locked loop comprising a loop filter and a voltage controlled oscillator coupled to the loop filter. The voltage controlled oscillator comprises first and second transistors and a low pass filter coupled to the second transistor. The low pass filter comprises a switched capacitor resistor.

BRIEF DESCRIPTION OF THE DRAWINGS

For a detailed description of exemplary embodiments of the invention, reference will now be made to the accompanying drawings in which:

FIG. 4 shows timing diagrams of clock signals used to operate the switched capacitor resistor; and FIG. 5 shows a transceiver comprising the phase locked loop of the preferred embodiments.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
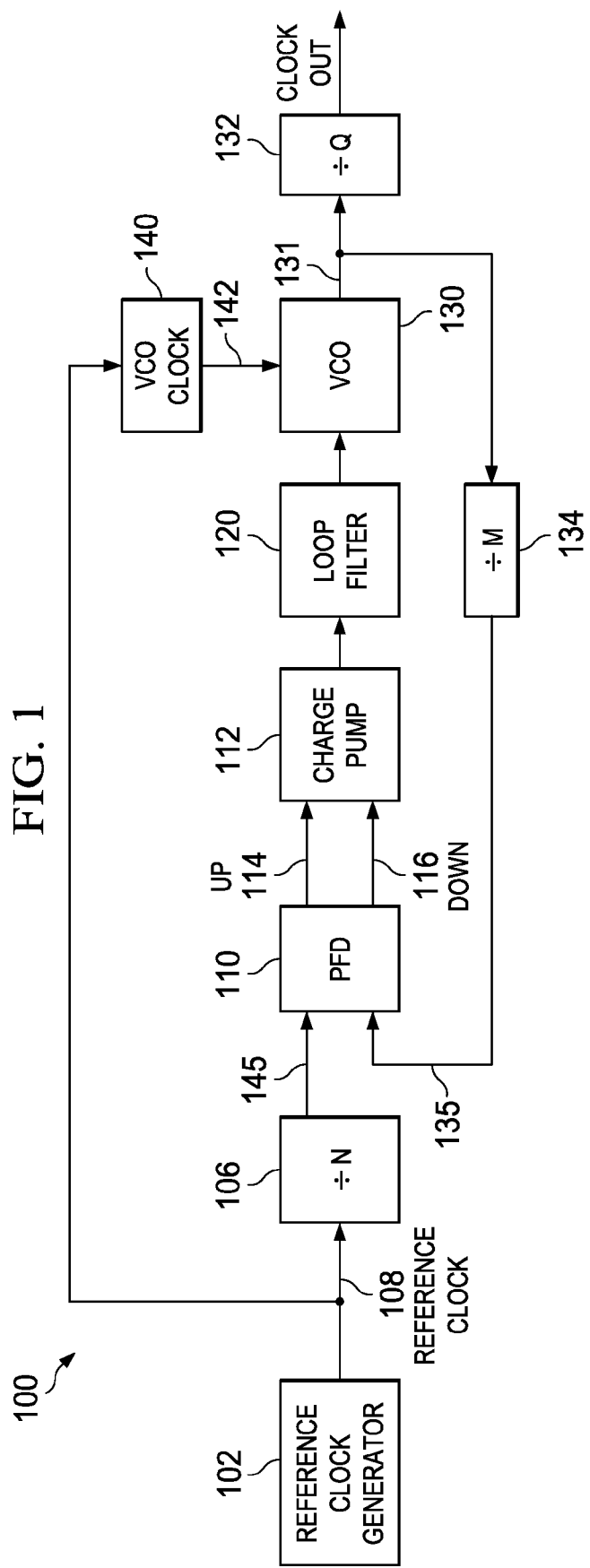
FIG. 1 shows a phase-locked loop in accordance with the preferred embodiments of the invention.

FIG. 1 illustrates a phase-locked loop (PLL) 100 in accordance with the preferred embodiments of the invention. The PLL 100 shown in FIG. 1 comprises an analog PLL (APLL) and preferably includes a reference clock generator 102 (although in some embodiments, the reference clock generator 102 may be separate from the actual PLL), a divide-by-N circuit 106, a phase-frequency detector (PFD) 110, a charge pump 112, a loop filter 120, a voltage controlled oscillator (VCO) 130, a divide-by-Q circuit 132, and a divide-by-M circuit 134. A VCO clock circuit 140 is also provided. The divide-by-N, Q, M circuits 106, 132, and 134 divide their input clock frequencies by a factor of N, Q, and M, respectively.

The reference clock generator 102 (which may comprise a crystal oscillator) generates a reference clock 108 and provides the reference clock 108 to the divide-by-N circuit 106 and the VCO clock circuit 140. The divide-by-N circuit 106 divides the frequency of the reference clock 108 by a factor of N. The divided down output signal 145 from the divide-by-N circuit 106 is provided as an input to the PFD 110. The output of the VCO 130 is divided down by the divide-by-M circuit 134, and the divided down output signal 135 from the divide-by-M circuit 134 is provided as an input to the PFD 110. The divide rations N and M are programmed such that, when the VCO is running at the target frequency, the frequencies of the two input signals 135 and 145 to the PFD 110 are equal.

The PFD 110 generates UP and DOWN error signals 114, 116 depending on whether the frequency of signal 145 is greater than or less than the frequency of signal 135. If the frequency of signal 145 is greater than the frequency of signal 135, the PFD 110 generates UP pulses as inputs to the charge pump 112 which thereby causes the VCO 130 to increase its output frequency. On the other hand, if the frequency of signal 145 is less than the frequency of signal 135, the PFD 110 generates DOWN pulses as inputs to the charge pump 112 to thereby cause the VCO 130 to decrease its output frequency. As a result of the operation of the feedback loop, the output frequency of the VCO is tightly controlled. The divide-by-Q circuit 132 is provided depending on the application to provide a precise clock output signal to an application circuit (not shown).

During normal operation, the signal 146 is held tightly phase locked to the signal 145 by means of the feedback action of the loop. This advantageously suppresses the phase noise of the oscillator. An important attribute of the PLL is called "loop bandwidth" which is a measure of the frequency band over which the loop provides suppression of oscillator phase noise.

Figure 2:
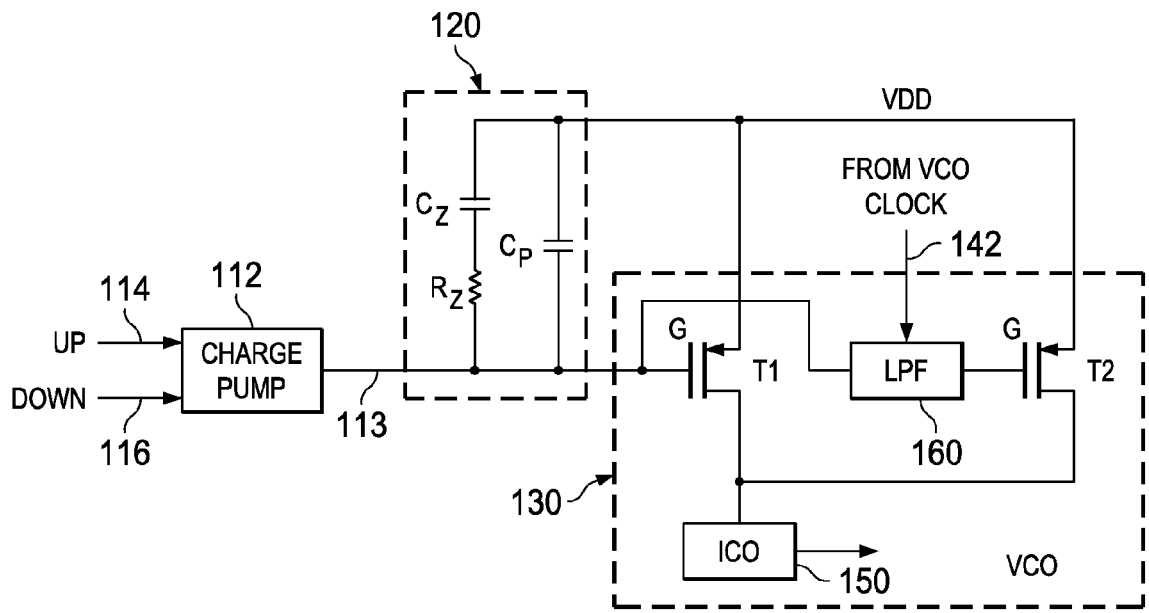
FIG. 2 illustrates a preferred embodiment of loop filter and voltage controlled oscillator as used in the system of FIG. 1.

FIG. 2 illustrates an embodiment of the loop filter 120 and the VCO 130, along with the charge pump 112. The loop filter 120 comprises a resistor $R_z$ and capacitors $C_z$ and $C_p$. Capacitor $C_z$ and resistor $R_z$ are connected in series between power supply voltage $V_{DD}$ and the charge pump output line 113. Further, capacitor $C_p$ is connected between $V_{DD}$ and the charge pump output line 113 and in parallel with the series combination of capacitor $C_z$ and resistor $R_z$. The loop filter 120 in FIG. 2 preferably is tied to positive supply voltage $V_{DD}$ rather than to ground.

The VCO 130 preferably comprises a voltage-to-current converter comprising, for example, transistors T1 and T2. The VCO 130 also comprises a low pass filter (LPF) 160 and a current controlled oscillator (ICO) circuit 150 which provides the output signal from the VCO. In general, voltage from the loop filter 120 is converted to a current for the ICO 150. The output signal 113 of the charge pump 112 as well as capacitor $C_p$ and resistor $R_z$ are connected to the gate G of transistor T1. The output signal 113 of the charge pump 112, capacitor $C_p$, and resistor $R_z$ are also connected via the LPF 160 to the gate G of transistor T2. Thus, the gates G of both transistors T1 and T2 are controlled via the filtered charge pump 112 output signal (albeit the gate signal for transistor T2 is passed through LPF 160). Transistors T1 and T2 preferably are implemented as P-channel metal oxide semiconductor (PMOS) devices. As such, transistors T1 and T2 use a $V_{DD}$ reference instead of a ground reference. The cut-off frequency of the LPF 160 is considerably smaller than the loop bandwidth of the PLL in at least some embodiments.

Using multiple (e.g., 2) transistors T1 and T2 enables each transistor to have a smaller transconductance value ($g_m$) compared to a single transistor being used. With the gate of transistor T2 being separated from the gate of transistor T1 by low pass filter 160, transistor T2 does not contribute any transconductance for most of the PLL loop bandwidth, but only contributes DC current (equal to the DC current supplied by T1) to the ICO 150. Thus, the effective $g_m$ of the V-to-I is now half of what it would have been if T1 and T2 were combined into a single device.

The equations for the loop bandwidth and the loop filter's zero frequency are as follows:

$$\text{Loop Bandwidth} = \frac{I_{CP} R_z g_m K_{ICO}}{M}$$

$$\text{Zero Frequency} = \frac{1}{2\pi R_z C_z}$$

where $I_{CP}$ is the output current on line 113 from the charge pump and $K_{ICO}$ is the gain of the VCO 130.

At least one consideration is that thermal noise from $R_z$ will modulate the voltage at the loop filter output. This in turn appears as phase noise in the oscillator output. The thermal noise voltage from $R_z$ is proportional to $\sqrt{R_z}$. Thus, one way of reducing this noise is to reduce the value of $R_z$. For example, making $R_z$ four times smaller reduces its noise voltage by a factor of 2. However, to do this without affecting the loop bandwidth, capacitor $C_z$ will have to be four times larger, so that position of the zero frequency is unchanged. This results in a large area penalty in an integrated circuit implementation.

This problem is solved by reducing the effective $g_m$ which can be accomplished in accordance with the preferred embodiments by splitting the transconductor into multiple units. The following analysis is based on a reduction in the $g_m$ value by a factor of 2, but the reduction factor can be other than 2 in other embodiments. If the value of $g_m$ is reduced by a factor of 2 and the charge pump current $I_{CP}$ is reduced by a factor of 2, the resistance value of $R_z$ can be increased by a factor of 4 without a change in the loop bandwidth and the phase noise caused by $R_z$. Noise is a linear function of $g_m$ and is related to $R_z$ as the square root of $R_z$.

With respect to the equation of the Zero Frequency, because $R_z$ can be increased by a factor of 4, then the capacitor value $C_z$ can be reduced by a factor of 4 without a change in the loop filter's zero frequency. Reducing the capacitor value $C_z$ means that the capacitor $C_z$ itself can be physically smaller which is advantageous for space-limited applications such as IC implementations of the PLL 100.

Referring again to FIG. 1, PLL 100 also comprises a VCO clock circuit 140 that generates a clock control signal 142 derived from the reference clock 108 generated by the reference clock generator. The use of the clock control signal 142 is described below.

Figure 3:
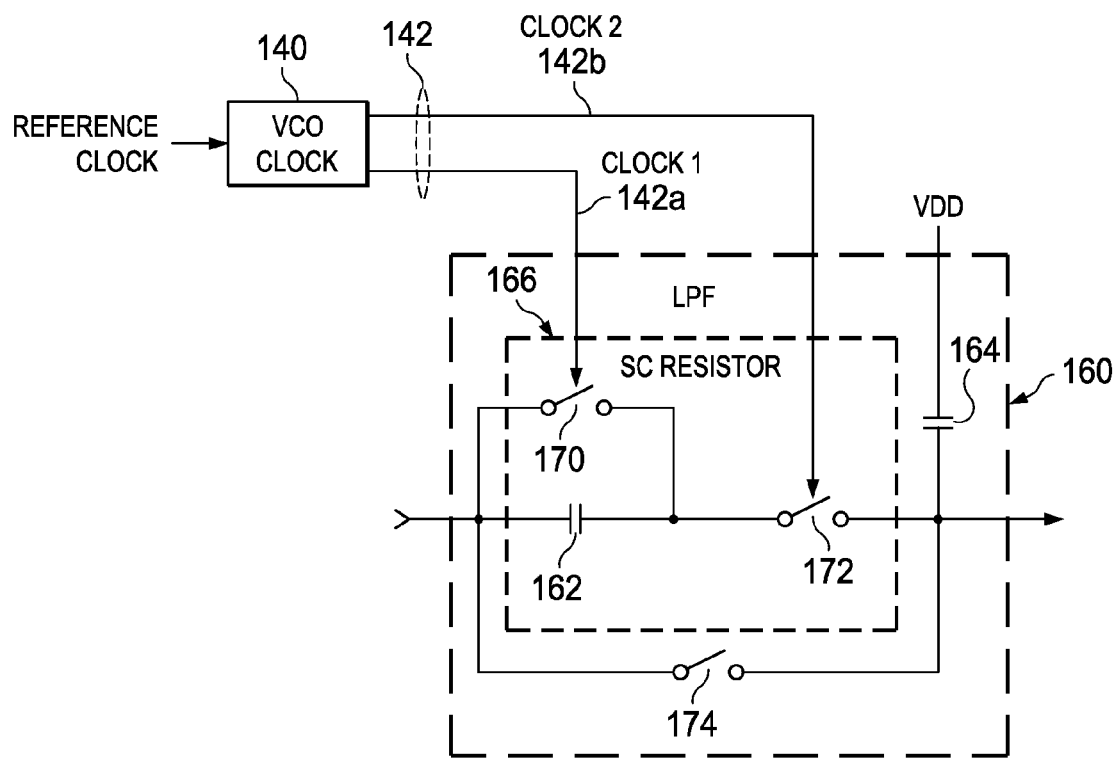
FIG. 3 shows a low pass filter using a switched capacitor resistor used with the voltage controlled oscillator.

At least one suitable circuit implementation for the LPF 160 is shown in FIG. 3. FIG. 3 shows an embodiment of the LPF 160 connected to the VCO clock circuit 140. LPF 260 preferably comprises a switched capacitor (SC) resistor 166. The SC resistor 166 comprises capacitor 162 and solid state switches 170 and 174. The LPF filter 160 also comprises capacitor 164 and switch 174. Switch 170 of the SC resistor is connected in parallel with capacitor 162 and switch 172 is connected in series with capacitor 162. The switches 170 and 172 are controlled via the clock control signal 142 which preferably is implemented as a pair of clock signals CLOCK1 (142a) and CLOCK2 (142b) generated by the VCO clock circuit 140. The CLOCK1 and CLOCK 2 signals generally are out of phase. Further, the width W2 of each pulse of CLOCK2 is less than the width W1 of the negative phase of CLOCK1 thereby ensuring that CLOCK1 and CLOCK2 are non-overlapping thereby ensuring CLOCK1 and CLOCK2 are not both high at the same time.

The capacitor 162 is charged when switch 172 is closed and switch 170 is open. Then, when the states of the switches reverse, the capacitor 162 begins to discharge through switch 170. As such, charge is repeatedly transferred into the capacitor 162 and then removed. The net transfer of charge is equivalent to electrical current and is computed as the amount of charge transferred in each cycle multiplied by the rate at which the net charge is transferred. The voltage across the SC resistor 166 is the current divided by the capacitance of capacitor 162 times the cycle rate noted above. As a result, the effective resistance value, which is computed as voltage divided by current, is:

$$R_{\textit{effective}} = \frac{1}{C_{162} f}$$

where $C_{162}$ is the capacitance value of capacitor 162 and f is the frequency of clocks CLOCK1 and CLOCK2 (which may have different phases and different duty cycles but preferably the same frequency). From the equation above for the effective resistance of resistor 166, it can be seen that effective resistance is inversely proportional to the capacitance of capacitor 162. Thus, a relatively small capacitor can be used in terms of capacitance and physical size. For example, a 0.1 picofarad capacitor can be used for capacitor 162 to produce an effective resistance of 1 megaohms for a frequency f of 10 megahertz, although numerous other values of capacitance for capacitor 162 are acceptable as well. By contrast, if a physical resistor were used in place of the SC resistor, such a resistor would have to be relatively large which again is problematic for space-constrained applications such as ICs. Further, a physical resistor, such as an NWELL resistor, would likely create a large parasitic capacitance to ground which, in turn, would form a potential divider between $V_{DD}$ and ground, and any noise on the supply voltage would find its way to the gate of transistor T2. The use of SC resistor 166 avoids these problems. A large resistor also results in increased noise coupling from the substrate. The use of SC resistor 166 avoids these problems.

By including two transistors in VCO 130 and configuring the transistors in parallel, the transconductance $g_m$ can be reduced, which by itself reduces the noise level. With $g_m$ reduced, the resistance of the resistor $R_z$ can be increased without a net chance in the level of noise. As a result, the size of the capacitor $C_z$ in the loop filter 120 can be much smaller than would otherwise be the case. Alternatively, the value of $g_m$ can be reduced by a factor of, for example, 2 and the resistance value of $R_z$ can be increased by the same factor (e.g., 2) to maintain a constant loop bandwidth but with a reduction in the amplitude of the noise. Thus, one can achieve a smaller loop filter capacitor $C_z$ albeit with the same noise level, or a lower noise level with the same size capacitor $C_z$.

Embodiments of the PLL 100 described can be used in a variety of applications. One application is in a wired or wireless transceiver. FIG. 5 shows a transceiver 200 comprising the PLL 100 coupled to a transmitter/receiver 202. The transceiver 200 may comprise any of a variety of transceivers such as a serial/deserializer (SERDES). An example of a SERDES transceiver is shown in U.S. Pat. Pub. 2005/0238093, incorporated herein by reference.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A phase locked loop, comprising;
   a loop filter; and
   a voltage controlled oscillator coupled to said loop filter;
   wherein said voltage controlled oscillator comprises first and second transistors and a low pass filter coupled to said second transistor, said low pass filter comprising a switched capacitor resistor;
   wherein said first and second transistors comprise gate terminals that receive signals referenced to a positive power supply voltage and not to ground.

2. The phase locked loop of claim 1 further comprising a charge pump having an output voltage, said charge pump output voltage connected a gate of the first transistor and to an input to the low pass filter.

3. The phase locked loop of claim 2 wherein an output of the low pass filter is connected to a gate of the second transistor.

4. The phase locked loop of claim 1 further comprising a voltage controlled oscillator clock circuit that receives as an input a reference clock and generates first and second output clock signals configured to alternately turn on and off switches in said switched capacitor resistor.

5. The phase locked loop of claim 1 wherein said first and second transistors comprise PMOS transistors.

6. A transceiver, comprising:
   a transmitter/receiver; and
   a phase locked loop comprising a loop filter and a voltage controlled oscillator coupled to said loop filter;
   wherein said voltage controlled oscillator comprises first and second transistors and a low pass filter coupled to said second transistor, said low pass filter comprising a switched capacitor resistor;
   wherein said first and second transistors comprise gate terminals that receive signals referenced to a positive power supply voltage and not to ground.

7. The transceiver of claim 6 wherein said phase locked loop further comprises a charge pump having an output voltage, said charge pump output voltage connected a gate of the first transistor and to an input to the low pass filter.

8. The transceiver of claim 7 wherein an output of the low pass filter is connected to a gate of the second transistor.

9. The transceiver of claim 8 wherein said phase locked loop further comprises a voltage controlled oscillator clock circuit that receives as an input a reference clock and generates first and second output clock signals configured to alternately turn on and off switches in said switched capacitor resistor.

10. The transceiver of claim 6 wherein said first and second transistors comprise PMOS transistors.

11. A phase locked loop, comprising;
    a loop filter providing an output signal; and
    a voltage controlled oscillator coupled to said loop filter;
    wherein said voltage controlled oscillator comprises first and second transistors and a low pass filter coupled to a gate of the second transistor, said low pass filter comprising a switched capacitor resistor, and wherein the output signal from the loop filter is provided to a gate of the first transistor and the output signal also is filtered by the low pass filter to produce a low pass filter output that is provided to a gate of the second transistor.

* * * * *